United States Patent
Kim et al.

(10) Patent No.: US 8,895,226 B2
(45) Date of Patent: Nov. 25, 2014

(54) COATING COMPOSITION FOR DUV FILTERING, METHOD OF FORMING PHOTORESIST PATTERN USING THE SAME AND METHOD OF FABRICATING SEMICONDUCTOR DEVICE BY USING THE METHOD

(71) Applicant: Samsung Electronics Co., Ltd., Suwon-Si (KR)

(72) Inventors: Hyun-Woo Kim, Seongnam-si (KR); Hai-Sub Na, Seoul (KR); Chil-Hee Chung, Seoul (KR); Han-Ku Cho, Seongnam-Si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/223,540

(22) Filed: Mar. 24, 2014

(65) Prior Publication Data

US 2014/0205950 A1    Jul. 24, 2014

Related U.S. Application Data

(62) Division of application No. 13/188,670, filed on Jul. 22, 2011, now Pat. No. 8,715,911.

(30) Foreign Application Priority Data

Jul. 23, 2010    (KR) .......................... 10-2010-0071605

(51) Int. Cl.
*G03F 7/20* (2006.01)
*G03F 7/038* (2006.01)
*G03F 7/095* (2006.01)
*G03F 7/11* (2006.01)
*G02B 5/20* (2006.01)
*G02B 5/22* (2006.01)

(52) U.S. Cl.
CPC .............. *G03F 7/0388* (2013.01); *G03F 7/095* (2013.01); *G03F 7/11* (2013.01); *G02B 5/208* (2013.01); *G02B 5/22* (2013.01)
USPC ................... 430/285.1; 430/273.1; 430/270.1

(58) Field of Classification Search
USPC ............................ 430/322, 324, 270.1, 273.1
See application file for complete search history.

(56) References Cited

U.S. PATENT DOCUMENTS

2005/0008864 A1    1/2005 Schenau et al.

FOREIGN PATENT DOCUMENTS

| | | |
|---|---|---|
| JP | 07209875 | 8/1995 |
| KR | 10-1991-0020488 A | 12/1991 |
| KR | 10-2004-0009384 A | 1/2004 |
| KR | 10-2005-0031257 A | 4/2005 |
| KR | 10-2008-0014388 A | 2/2008 |

*Primary Examiner* — Caleen Sullivan
(74) *Attorney, Agent, or Firm* — Volentine & Whitt, PLLC

(57) ABSTRACT

Provided are a coating composition for deep ultraviolet (DUV) filtering during an extreme ultraviolet (EUV) exposure, the coating composition including about 100 parts by weight of a solvent including a first solvent (the first solvent being an alcoholic solvent); and about 0.05 parts by weight to about 5 parts by weight of a coating polymer having a degree of absorption of about 50%/μm or greater with respect to 193-nm incident light.

17 Claims, 6 Drawing Sheets

↓ : EUV   ↓ : DUV

COATING COMPOSITION FOR DUV FILTERING, METHOD OF FORMING PHOTORESIST PATTERN USING THE SAME AND METHOD OF FABRICATING SEMICONDUCTOR DEVICE BY USING THE METHOD

CROSS-REFERENCE TO RELATED APPLICATION

This application is a Divisional of U.S. application Ser. No. 13/188,670, filed Jul. 22, 2011, issued on May 16, 2014 as U.S. Pat. No. 8,715,911, and which claims priority to Korean Patent Application No. 10-2010-0071605, filed on Jul. 23, 2010, in the Korean Intellectual Property Office, and entitled: "Coating Composition for DUV Filtering, Method of Forming Photoresist Pattern Using the Same and Method of Fabricating Semiconductor Device by Using the Method," the disclosure of which is incorporated by reference herein in its entirety.

BACKGROUND

1. Field

Embodiments relate to a coating composition for deep ultraviolet (DUV) filtering, a method of forming a photoresist pattern using the same, and a method of fabricating a semiconductor device by using the method.

2. Description of the Related Art

Semiconductor devices have become increasingly more integrated and smaller in size, which has led to ongoing demand for methods of precisely forming fine patterns. In particular, methods of precisely forming fine patterns that are relatively simple to conduct and are low cost are desirable.

SUMMARY

Embodiments are directed to a coating composition for DUV filtering, method of forming photoresist pattern using the same and method of fabricating semiconductor device by using the method.

At least one of the above and other features and advantages may be realized by providing a coating composition for deep ultraviolet (DUV) filtering during an extreme ultraviolet (EUV) exposure, which may include: 100 parts by weight of a solvent including a first solvent, the first solvent being an alcohol-based solvent, and about 0.05 parts by weight to about 5 parts by weight of a coating polymer having a degree of absorption of about 50%/µm or greater with respect to 193-nm wavelength incident light. The coating polymer may include a backbone having a repeating unit including benzene, naphthalene, or anthracene, a branch bonded to a backbone, the branch having a repeating unit including benzene, naphthalene, or anthracene, or a repeating unit including a carboxyl group.

The coating polymer may include the branch bonded to a backbone, wherein the branch further includes a C1-C5 alkylene group between the backbone and the benzene, naphthalene, or anthracene.

The coating polymer may be selected from the group of poly(hydroxystyrene), a copolymer of a hydroxystyrene derivative and hydroxystyrene, novolac resin, and a mixture thereof.

The coating polymer may be a copolymer of a hydroxystyrene derivative and hydroxystyrene, the copolymer being a block-copolymer or a random copolymer and being represented by Formula 1 below:

<Formula 1>

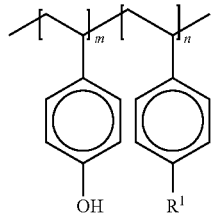

wherein m and n are integers equal to or greater than 1, where $0.4 \leq m/(m+n) < 1$; and $R_1$ is a hydrogen atom, a $C_1$-$C_6$ alkyl group, a $C_1$-$C_6$ alkoxy group, a $C_1$-$C_6$ alkoxycarbonyloxy group, a $C_2$-$C_6$ acetal group, a $C_2$-$C_6$ acrylate group, trifluoromethyl, trichloromethyl, tribromomethyl, or a halogen atom.

The coating polymer may have a degree of absorption of about 40%/µm or greater with respect to 248-nm incident light. The coating polymer may have a degree of absorption of about 50%/µm or greater with respect to 220-nm incident light.

The first solvent may include a C2-C8 monohydric alcohol. The first solvent may include at least one selected from the group of methanol, ethanol, 1-propaneol, isopropaneol, n-propaneol, n-butanol, 2-butanol, tert-butanol, 1-pentanol, 2-pentanol, 3-pentanol, n-hexanol, cyclohexanol, 2-methyl-2-butanol, 3-methyl-2-butanol, 2-methyl-1-butanol, 3-methyl-1-butanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 2,2-dimethyl-3-pentanol, 2,3-dimethyl-3-pentanol, 2,4-dimethyl-3-pentanol, 4,4-dimethyl-2-pentanol, 3-ethyl-3-pentanol, 1-heptanol, 2-heptanol, 3-heptanol, 2-methyl-2-hexanol, 2-methyl-3-hexanol, 5-methyl-1-hexanol, 5-methyl-2-hexanol, 2-ethyl-1-hexanol, 4-methyl-3-heptanol, 6-methyl-2-heptanol, 1-octanol, 2-octanol, 3-octanol, 2-propyl-1-pentanol, 2,4,4-trimethyl-1-pentanol, 2,6-dimethyl-4-heptanol, 3-ethyl-2,2-dimethyl-pentanol, 1-nonanol, 2-nonanol, 3,5,5-trimethyl-1-hexanol, 1-decanol, 2-decanol, 4-decanol, 3,7-dimethyl-1-octanol, and 3,7-dimethyl-3-octanol.

The solvent may include about 5 parts by weight to about 30 parts by weight of a second solvent, based on 100 parts by weight of the solvent, the second solvent including one selected from the group of ethyleneglycol, propyleneglycol, tetrahydrofuran, dioxane, ethyleneglycol monomethylether, ethyleneglycol monoethylether, ethyleneglycol dimethylether, ethyleneglycol diethylether, diethyleneglycol monomethylether, diethyleneglycol monoethylether, diethyleneglycol dimethylether, diethyleneglycol diethylether, diethyleneglycol ethylmethylether, propyleneglycol monomethylether, propyleneglycol monoethylether; ethyleneglycol ethyletheracetate, diethyleneglycol ethyletheracetate, propyleneglycol ethyletheracetate, propyleneglycol monomethyletheracetate; toluene, xylene, acetone, methylethylketone, methylisobutylketone, cyclohexanone, 4-hydroxy-4-methyl-2-pentanone, diacetonealcohol, acetic acidmethyl, acetic acidethyl, acetic acidpropyl, acetic acidbutyl, 2-hydroxypropionic acid ethyl, 2-hydroxy-2-methylpropionic acid methyl, 2-hydroxy-2-methylpropionic acid ethyl, ethoxyacetic acid ethyl, hydroxyacetic acid ethyl, 2-hydroxy-3-methylbutanoic acid methyl, 3-methoxypropionic acid methyl, 3-methoxypropionic acid ethyl, 3-ethoxypropionic acid ethyl, 3-ethoxypropionic acid methyl, water, and a mixture thereof.

The coating polymer may have a solubility with respect to the first solvent that is about 10 times greater than that of a (meth)acrylate-based resin with respect to the first solvent. The coating polymer may have a weight average molecular weight of about 2,000 to about 100,000, as measured by gel permeation chromatography (GPC). The coating composition may further include a photo-acid generator (PAG). The coating composition may further include a surfactant. The coating polymer may be included in an amount of about 0.1 parts by weight to about 3 parts by weight. The coating polymer may be included in an amount of about 0.3 parts by weight to about 2.5 parts by weight.

At least one of the above and other features and advantages may also be realized by providing a method of forming a photoresist pattern, the method including: forming a first layer of a photoresist composition for extreme ultraviolet (EUV) on a substrate, forming a second layer of a coating composition for deep ultraviolet (DUV) filtering on the first layer, exposing the first and second layers with an exposure mask, and developing the first and second layers, wherein the coating composition for DUV filtering includes: 100 parts by weight of a solvent including a first solvent, the first solvent being an alcohol-based solvent, and about 0.05 parts by weight to about 5 parts by weight of a coating polymer having a degree of absorption of about 50%/μm or greater with respect to 193-nm incident light.

The second layer may have a thickness of about 5 nm to about 100 nm. The coating polymer may include a backbone having a repeating unit including benzene, naphthalene, or anthracene, a branch bonded to a backbone, the branch having a repeating unit including benzene, naphthalene, or anthracene, or a repeating unit including a carboxyl group. The coating polymer may include the branch bonded to a backbone, the branch further including a $C_1$-$C_5$ alkylene group between the backbone and the benzene, naphthalene, or anthracene.

The coating polymer may be selected from the group of poly(hydroxystyrene), a copolymer of a hydroxystyrene derivative and hydroxystyrene, novolac resin, and a mixture thereof. The coating polymer may be a copolymer of a hydroxystyrene derivative and hydroxystyrene, the copolymer being a block-copolymer or a random copolymer and being represented by Formula 1 below:

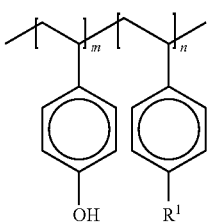

<Formula 1> wherein m and n are integers equal to or greater than 1, where $0.4 \leq m/(m+n) < 1$; and $R_1$ is a hydrogen atom, a $C_1$-$C_6$ alkyl group, a $C_1$-$C_6$ alkoxy group, a $C_1$-$C_6$ alkoxycarbonyloxy group, a $C_2$-$C_6$ acetal group, a $C_2$-$C_6$ acrylate group, trifluoromethyl, trichloromethyl, tribromomethyl, or a halogen atom.

The first solvent may include a $C_2$-$C_8$ monohydric alcohol.

The method may further include post-exposure baking (PEB) between the exposing and the developing of the first and second layers, wherein the PEB is performed at a temperature of about 50° C. to about 200° C.

The photoresist composition for EUV may include a positive photoresist.

Developing of the first and second layers may include developing the first and second layers by using a developing solution, wherein the coating polymer is soluble in the developing solution. Developing the first and second layers may include almost completely removing the second layer by the developing solution. The developing solution may be an alkali solution.

The method may further include baking the first layer before the forming of the second layer. The method may further include baking the second layer before exposing of the first and second layers. The coating polymer may be included in an amount of about 0.1 parts by weight to about 3 parts by weight. The coating polymer may be included in an amount of about 0.3 parts by weight to about 2.5 parts by weight.

At least one of the above and other features and advantages may also be realized by providing a method of fabricating a semiconductor device including forming a photoresist pattern on a semiconductor substrate, and etching a layer underlying the photoresist pattern with the photoresist pattern as an etch mask, wherein forming the photoresist pattern on the semiconductor substrate includes: forming a first layer of a photoresist composition for extreme ultraviolet (EUV) on the semiconductor substrate, forming a second layer of a coating composition for deep ultraviolet (DUV) filtering on the first layer, the coating composition for DUV filtering including 100 parts by weight of a solvent having a first solvent that is an alcohol-based solvent, and about 0.05 parts by weight to about 5 parts by weight of a coating polymer having a degree of absorption of about 50%/μm or greater with respect to 193-nm incident light, exposing the first and second layers with an exposure mask, and developing the first and second layers.

The semiconductor substrate may include: a base substrate, and a first material layer on the base substrate, the first material layer having an etch selectivity with respect to the base substrate, and etching the layer includes etching the photoresist pattern, using the photoresist pattern as the etch mask.

At least one of the above and other features and advantages may also be realized by providing a semiconductor wafer, including: a semiconductor substrate, an extreme ultraviolet (EUV) photoresist layer on the semiconductor substrate, and a deep ultraviolet (DUV)-filtering coating layer on the EUV photoresist layer, wherein the DUV-filtering coating layer has a degree of absorption of about 50%/μm or greater with respect to incident light having a wavelength of about 193 nm.

At least one of the above and other features and advantages may also be realized by providing a method of forming a photoresist pattern, the method including: forming a first layer of a photoresist composition for extreme ultraviolet (EUV) on a substrate, forming a deep ultraviolet (DUV) shield layer on the first layer, exposing the first layer with an exposure mask, and developing the first layer.

BRIEF DESCRIPTION OF THE DRAWINGS

The embodiments will become more apparent to those of ordinary skill in the art by describing in detail exemplary embodiments with reference to the attached drawings, in which.

DETAILED DESCRIPTION

Figure 1A:
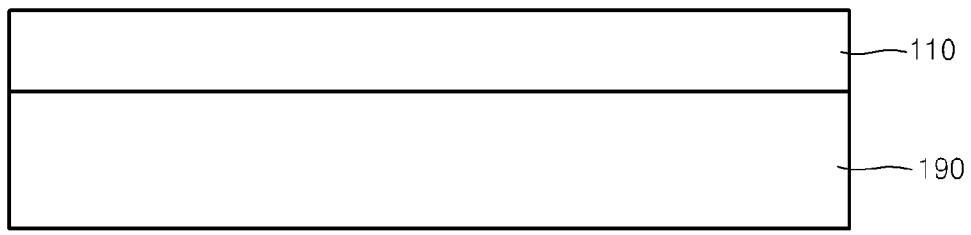
FIGS. 1A to 1F illustrate cross-sectional views of stages in a method of forming a photoresist pattern, according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section, and vice versa, without departing from the teachings of the present invention.

The terms used herein are for the purpose of describing particular embodiments only and are not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, layers, regions, elements, components, and/or groups thereof, but do not preclude the presence or addition of one or more other features, integers, steps, operations, layers, regions, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In order to implement a half pitch resolution of less than 40 nm, lithography using an extremely short-wavelength light source, for example, an extreme ultraviolet (EUV) light source having a wavelength of about 13.5 nm, may be used. However, light emitted from a EUV light source may include both in-band light (intended for use in EUV lithography) and partially out-of-band light of 100-400 nm, (not intended for use). The out-of-band light may be a deep ultraviolet (DUV) wavelength of light and may be approximately 1-10% of the total light intensity.

Coating compositions for DUV filtering, according to embodiments, may partially or fully exclude such out-of-band light, and thus may improve resolution and variance of a pattern formed by EUV lithography.

In an implementation, the coating composition for DUV filtering may include a solvent and a coating polymer. The coating composition may include about 0.05 parts by weight to about 5 parts by weight of the coating polymer with respect to 100 parts by weight of the solvent. The solvent may include a first solvent that is an alcohol-based solvent. According to an embodiment, the amount of the coating polymer with respect to the solvent may be sufficient, e.g. not too small, to facilitate removal of the solvent in a relatively short time, and to avoid a coating layer of the coating polymer that is too thin. In addition, the amount of the coating polymer with respect to the solvent may be sufficient, e.g., not too large, to facilitate achieving a uniform thickness of a coated layer. The amount of the coating polymer may be from about 0.1 parts by weight to about 3 parts by weight, and in some embodiments, from about 0.3 parts by weight to about 2.5 parts by weight.

For example, the first solvent, which is an alcohol-based solvent, may include at least one of methanol, ethanol, 1-propaneol, isopropaneol, n-propaneol, n-butanol, 2-butanol, tert-butanol, 1-pentanol, 2-pentanol, 3-pentanol, n-hexanol, cyclohexanol, 2-methyl-2-butanol, 3-methyl-2-butanol, 2-methyl-1-butanol, 3-methyl-1-butanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 2,2-dimethyl-3-pentanol, 2,3-dimethyl-3-pentanol, 2,4-dimethyl-3-pentanol, 4,4-dimethyl-2-pentanol, 3-ethyl-3-pentanol, 1-heptanol, 2-heptanol, 3-heptanol, 2-methyl-2-hexanol, 2-methyl-3-hexanol, 5-methyl-1-hexanol, 5-methyl-2-hexanol, 2-ethyl-1-hexanol, 4-methyl-3-heptanol, 6-methyl-2-heptanol, 1-octanol, 2-octanol, 3-octanol, 2-propyl-1-pentanol, 2,4,4-trimethyl-1-pentanol, 2,6-dimethyl-4-heptanol, 3-ethyl-2,2-dimethyl-pentanol, 1-nonanol, 2-nonanol, 3,5,5-trimethyl-1-hexanol, 1-decanol, 2-decanol, 4-decanol, 3,7-dimethyl-1-octanol, and 3,7-dimethyl-3-octanol. The first solvent may be a $C_2$-$C_8$ monohydric alcohol.

The coating polymer may be a polymer that is soluble in a solvent. For example, the coating polymer may include (i) a polymer including a backbone having a repeating unit including benzene, naphthalene, or anthracene, (ii) a polymer including a branch bonded to a backbone, the branch including a repeating unit including benzene, naphthalene, or anthracene, and/or (iii) a polymer having a repeating unit including a carboxyl group. The repeating unit of the branch may further include a $C_1$-$C_5$ alkylene group between the backbone and the benzene, naphthalene, or anthracene.

These repeating units may be from about 30 wt % to about 100 wt % of the respective polymers. For example, the repeating units may be from about 50 wt % to about 95 wt % of the respective polymers, and in some embodiments, from about 60 wt % to about 90 wt %.

The polymer including a backbone having a repeating unit of benzene may be a novolac resin.

The polymer having the branch including a repeating unit including benzene may be poly(hydroxystyrene) or a polymer of a hydroxystyrene derivative in which hydrogen of the hydroxyl group is substituted with methyl, ethyl, n-propyl, isopropyl, n-butyl, isobutyl, t-butyl, methoxy, ethoxy, n-propoxy, isopropoxy, n-butoxy, isobutoxy, t-butoxy, t-butoxycarbonyloxy, acetal, or t-butylacrylate.

The polymer including the branch having a repeating unit including naphthalene or anthracene may be a polymer including any of repeating units represented by Formulae 2-5 below, or a polymer analogous to these polymers.

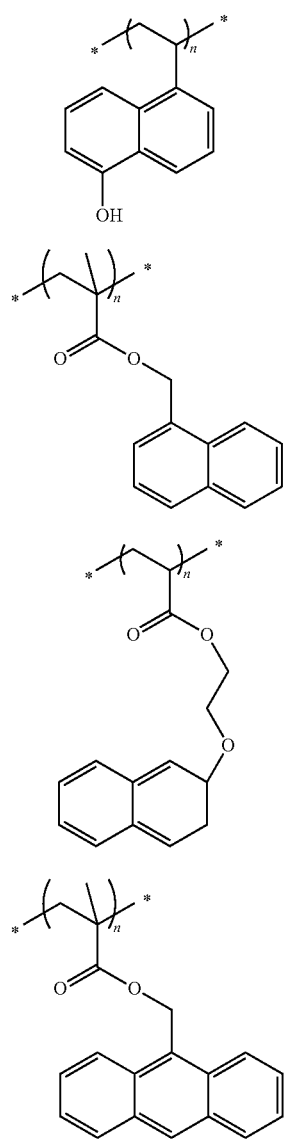

<Formula 2>

<Formula 3>

<Formula 4>

<Formula 5>

The polymer having a repeating unit including a carboxyl group may be a polymer of vinyl-based monomers including carboxyl groups, such as polyacrylic acid, or polymethacrylic acid.

In some embodiments, the coating polymer may be at least one selected from the group of poly(hydroxystyrene), a copolymer of a hydroxystyrene derivative and hydroxystyrene, novolac resin, and a mixture thereof.

The coating polymer may be a copolymer of a hydroxystyrene derivative and hydroxystyrene that are block-copolymerized or randomly copolymerized to have a structure represented by Formula 1 below.

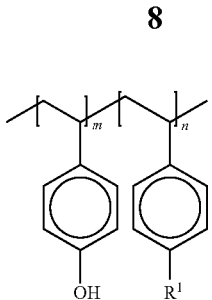

<Formula 1>

(wherein m and n are integers of 1 or greater, where $0.4 \leq m/(m+n) < 1$; and $R^1$ is a hydrogen atom, a $C_1$-$C_6$ alkyl group, a $C_1$-$C_6$ alkoxy group, a $C_1$-$C_6$ alkoxycarbonyloxy group, a $C_2$-$C_6$ acetal group, a $C_2$-$C_6$ acrylate group, trifluoromethyl, trichloromethyl, tribromomethyl, or a halogen atom)

In some embodiments, $R^1$ in Formula 1 may be methyl, ethyl, n-propyl, isopropyl, n-butyl, isobutyl, t-butyl, methoxy, ethoxy, n-propoxy, isopropoxy, n-butoxy, isobutoxy, t-butoxy, t-butoxycarbonyloxy, acetal, or t-butylacrylate.

Although the coating composition may have a random polymer structure, the coating composition, according to embodiments, may be represented by Formula 1 with an indication of the number of repeating units for convenience of illustration. The coating polymer of Formula 1 may include only one kind of hydroxystyrene derivative. However, in some embodiments the coating polymer may be a copolymer including two or more kinds of hydroxystyrene derivatives. The percentage of hydroxystyrene repeating units may be about 40% or greater in number, irrespective of the kinds of hydroxystyrene derivatives in the copolymer.

The coating polymer may have a degree of absorption of about 50%/μm or greater, with respect to incident light having a wavelength of 193 nm. In some embodiments, the coating polymer may have a degree of absorption of about 60%/μm or greater with respect to incident light having a wavelength of 193 nm. In some embodiments, the coating polymer may have a degree of absorption of about 65%/μm or greater with respect to incident light having a wavelength of 193 nm.

In some embodiments, the coating polymer may have a degree of absorption of about 50%/μm or greater with respect to incident light having a wavelength of 220 nm. In some embodiments, the coating polymer may have a degree of absorption of about 60%/μm or greater with respect to incident light having a wavelength of 220 nm. In some embodiments, the coating polymer may have a degree of absorption of about 65%/μm or greater with respect to incident light having a wavelength of 220 nm.

In some embodiments, the coating polymer may have a degree of absorption of about 40%/μm or greater with respect to incident light having a wavelength of 248 nm. In some embodiments, the coating polymer may have a degree of absorption of about 45%/μm or greater with respect to incident light having a wavelength of 248 nm. In some embodiments, the coating polymer may have a degree of absorption of about 50%/μm or greater with respect to incident light having a wavelength of 248 nm.

The term "degree of absorption" as used herein, refers to a percentage of light absorbed by a layer, rather than transmitted through the layer, per unit thickness of the layer with respect to the amount of light incident on the layer.

The degree of absorption may be quantitated in terms of transmittance. The term "transmittance," as used herein, refers to a percentage of light passing through a layer per unit thickness of the layer with respect to the amount of light incident on the layer. The degree of absorption of the coating polymer may be determined from transmittance. For example, the coating polymer may have a transmittance of about 50%/μm or less with respect to incident light having a wavelength of 193 nm. In some embodiments, the coating polymer may have a transmittance of about 40%/μm or less with respect to incident light having a wavelength of 193 nm. In some embodiments, the coating polymer may have a transmittance of about 35%/μm or less with respect to incident light having a wavelength of 193 nm.

In some embodiments, the coating polymer may have a transmittance of about 50%/μm or less with respect to incident light having a wavelength of 248 nm. In some embodiments, the coating polymer may have a transmittance of about 45%/μm or less with respect to incident light having a wavelength of 248 nm. In some embodiments, the coating polymer may have a transmittance of about 40%/μm or less with respect to incident light having a wavelength of 248 nm.

The coating polymer may have a weight average molecular weight of about 2,000 to about 100,000, as measured by gel permeation chromatography (GPC). The weight average molecular weight of the coating polymer may be sufficient, e.g., not too small, to facilitate achieving a composition of the coating polymer with a high enough viscosity to form a film. In addition, the weight average molecular weight of the coating polymer may be sufficient, e.g., not too large, to facilitate controlling the thickness of a film.

A compound, including a cyclic hydrocarbon such as benzene, naphthalene, or anthracene in a backbone or branch, may more efficiently absorb a DUV wavelength of light of less than 200 nm than a DUV wavelength of light of 200 nm or greater. It may be inferred from this that a coating composition for DUV filtering may have a higher degree of absorption with respect to 194-nm DUV light than to 220-nm or 249-nm DUV light.

The coating polymer may have a polydispersity index (PDI) of about 1.0 to about 2. The PDI of the coating polymer may be sufficient, e.g., not too high, to facilitate controlling physical characteristics of a film formed from the coating polymer.

The first solvent may be chosen to ensure that the coating polymer has a high solubility. The first solvent may be chosen to ensure that the coating polymer has a solubility that is about 10 times higher than that of (meth)acrylate-based resin with respect to the first solvent. The (meth)acrylate-based resin may be an aliphatic (meth)acrylate-based polymer. Examples of the (meth)acrylate-based polymer may include one selected from the group of polymethylmethacrylate (PMMA), poly(t-butylmethacrylate), poly(methacrylic acid), poly(norbornylmethacrylate), binary or higher multiple copolymers thereof, and mixtures thereof. However, other (meth)acrylate-based polymer may be included in the binary or higher multiple copolymers.

In order to facilitate control of coating characteristics, the coating composition for DUV filtering may include about 5 parts by weight to about 30 parts by weight of a second solvent with respect to 100 parts by weight of the entire solvent. Coating characteristics of the coating composition for DUV filtering may be dependant on the viscosity thereof, surface characteristics of a target to be coated, and the like. By adding the second solvent to the first solvent, the viscosity of the coating composition and the surface characteristics of the target may be controlled, thereby facilitating control or adjustment of the coating characteristics. The amount of the second solvent may be sufficient, e.g., not too large, to prevent erosion of a photoresist film contacting the second solvent, and/or inter-mixing of the photoresist film with the second solvent.

Examples of the second solvent may include ethyleneglycol, propyleneglycol, tetrahydrofuran, dioxane, ethyleneglycol monomethylether, ethyleneglycol monoethylether, ethyleneglycol dimethylether, ethyleneglycol diethylether, diethyleneglycol monomethylether, diethyleneglycol monoethylether, diethyleneglycol dimethylether, diethyleneglycol diethylether, diethyleneglycol ethylmethylether, propyleneglycol monomethylether, propyleneglycol monoethylether; ethyleneglycol ethyletheracetate, diethyleneglycol ethyletheracetate, propyleneglycol ethyletheracetate, propyleneglycol monomethyletheracetate; toluene, xylene, acetone, methylethylketone, methylisobutylketone, cyclohexanone, 4-hydroxy-4-methyl-2-pentanone, diacetonealcohol, acetic acidmethyl, acetic acidethyl, acetic acidpropyl, acetic acidbutyl, 2-hydroxypropionic acid ethyl, 2-hydroxy-2-methylpropionic acid methyl, 2-hydroxy-2-methylpropionic acid ethyl, ethoxyacetic acid ethyl, hydroxyacetic acid ethyl, 2-hydroxy-3-methylbutanoic acid methyl, 3-methoxypropionic acid methyl, 3-methoxypropionic acid ethyl, 3-ethoxypropionic acid ethyl, 3-ethoxypropionic acid methyl, water, and a mixture thereof.

The coating composition for DUV filtering may further include an acid generator. For example, the acid generator may be a photo-acid generator (PAG). Any suitable acid generators that are known in the art may be used. Examples of suitable acid generators may include onium salts, halogen compounds, nitrobenzyl esters, alkylsulfonates, diazonaphtoquinones, iminosulfonates, disulfones, diazomethanes, and sulfonyloxyketones. In the coating composition for DUV filtering, the amount of the acid generator may be from about 1 wt % to about 20 wt %, based on the weight of the coating polymer.

If desired, the coating composition for DUV filtering may further include a surfactant. In order to have improved coating characteristics. Any suitable surfactants that are known in the art may be used. For example, at least one selected from among cationic surfactants, anionic surfactants, non-ionic surfactants, and amphoteric surfactants may be used. Examples of suitable surfactants include fluorine-based surfactants commercially available under various product names, including BM-1000, BM-1100 (available from BM Chemie Co.); MEGAFAC F142D, MEGAFAC F172, MEGAFAC F173, MEGAFAC F183 (available from Dainippon Ink & Chemicals, Inc.); FLUORAD FC-135, FLUORAD FC-170C, FLUORAD FC-430, FLUORAD FC-431 (available from Suminoto 3M); SURFLON S-112, SURFLON S-113, SURFLON S-131, SURFLON S-141, SURFLON S-145 (available from Asahi Glass Co., Ltd); SH-28PA, SH-190, SH-193, SZ-6032, SF-8428 (available from Toray Dow Corning Silicone Co., Ltd); and NBX-15 (available from NEOS Co.), and non-fluorine-based surfactants commercially available under various product names, including POLYFLOW No. 75 (Kyoeisha Chemical Co., Ltd.). The amount of the surfactant may be from about 0.5 wt % to about 5 wt % of the weight of the coating composition.

The coating composition for DUV filtering may be useful for blocking out-of-band light of about 100 nm to about 400 nm, not intended for use in EUV lithography, and in some embodiments, out-of-band of light of about 100 nm to about 300 nm.

Hereinafter, methods of forming photoresist patterns on a substrate by using the coating composition for DUV filtering, according to embodiments of the inventive concept will be described. According to an embodiment, there is provided a method of forming a photoresist pattern on a substrate by using the coating composition for DUV filtering. The substrate may be a silicon substrate, a silicon-on-insulator (SOI)

substrate, a silicon-germanium substrate, or a gallium-arsenide substrate. However, the substrate is not limited thereto and a variety of substrates may be used. For example, a bare wafer, or a substrate having a structure on an active surface thereof may be used.

According to the current embodiment, the method of forming a photoresist pattern may include: forming a first layer of a photoresist composition for EUV on the substrate; baking the first layer; forming a second layer of a coating composition for DUV filtering on the first layer; baking the second layer; exposing the first and second layers with an exposure mask; and developing the first and second layers. The coating composition for DUV filtering may include 100 parts by weight of a solvent (including a first solvent that is an alcohol-based solvent), and about 0.5 parts by weight to about 5 parts by weight of a coating polymer (having a degree of absorption of about 50%/μm or greater with respect to 193-nm incident light).

Hereinafter, the steps of the method, according to embodiments, will be described in more detail. FIGS. 1A to 1F illustrate cross-sectional views of stages in the method of forming a photoresist pattern.

Referring to FIG. 1A, a first layer 110 of a photoresist composition for EUV may be formed on a substrate 190. The acronym "EUV" for extreme ultraviolet ray indicates a wavelength of light of about 100 nm or less, e.g., a wavelength of light of about 50 nm or less. In some embodiments, the EUV may be a wavelength of light of about 10 nm to about 20 nm. In some embodiments, the EUV may be a wavelength of light of about 13.5 nm.

The photoresist composition for EUV may include a photoresist composition, including a photoresist compound that may undergo chemical changes by EUV irradiation to have different solubilities in a developing solution. The photoresist compound may be a (meth)acrylate-based polymer. The (meth)acrylate-based polymer may be an aliphatic (meth)acrylate-based polymer. Examples of the (meth)acrylate-based polymer may include one of polymethylmethacrylate (PMMA), poly(t-butylmethacrylate), poly(methacrylic acid), poly(norbornylmethacrylate), (meth)acrylate-based polymers, binary or multiple copolymers thereof, and mixtures thereof. However, any suitable EUV photoresist polymer that is known in the art may be used as the photoresist compound. It will be understood by those of ordinary skill in the art that suitable EUV photoresist compositions are commercially available.

Suitable photoresist compounds may include positive photoresists and negative photoresists. In some embodiments, the photoresist compound may be a positive photoresist. In this regard, the positive photoresist may be easily removed using an alkali developing solution in a developing process.

The photoresist composition for EUV may further include an acid generator. In some embodiments, the acid generator may be a photo-acid generator (PAG). Any suitable acid generator that is known in the art may be used. Examples of suitable acid generators may include onium salts, halogen compounds, nitrobenzyl esters, alkylsulfonates, diazonaphtoquinones, iminosulfonates, disulfones, diazomethanes, and sulfonyloxyketones. In the photoresist composition for EUV, the amount of the acid generator may be from about 1 wt % to about 20 wt %, based on the weight of the photoresist compound.

The first layer 110 may be formed on the substrate 190 by using, in some embodiments, spin coating or roll coating. In some embodiments, before the forming of the first layer 110, a surface of the substrate 190 on which the first layer 110 is to be formed may be treated with a primer material, such as hexamethyldisilazane (HMDS) or trimethylsilyldiethylamine (TMSDEA), to enhance adhesion of the first layer 110 to the substrate 190.

Then, the first layer 110 may be soft-baked. The soft baking may be performed at a temperature of about 50° C. to about 150° C. for about 20 seconds to about 5 minutes. The soft baking may fully or partially remove a solvent from the first layer 110. However, the soft baking may be omitted depending on the viscosity and thickness of the first layer 110, and the kind of solvent used in the photoresist composition.

Figure 1B:
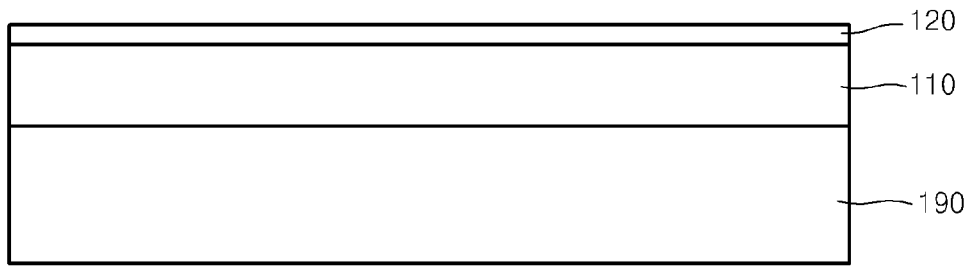

Referring to FIG. 1B, a second layer 120 of the coating composition for DUV filtering may be formed on the first layer 110. The coating composition for DUV filtering, may be as described above. As such, a repeated detailed description of the coating composition for DUV filtering is omitted. Like the first layer 110, the second layer 120 may be formed on the first layer 110 by using a suitable coating method, for example, spin coating or roll coating. The substrate 190 may be a semiconductor substrate. In some embodiments, a semiconductor wafer on which first and second layers are formed, as illustrated in FIG. 1B, may be used as the substrate 190. The second layer 120 may be a DUV filtering layer capable of blocking a DUV wavelength of light. The DUV wavelength of light may be from about 100 nm to about 300 nm.

A solvent for the coating composition for DUV filtering that may be used to form the second layer 120 may be a solvent that is barely able to dissolve the first layer 110. In an implementation, the solvent for the coating composition for DUV filtering may dissolve the coating polymer for DUV filtering well, and barely dissolves the photoresist compound of the first layer 110. For example, the coating composition for DUV filtering may dissolve the photoresist compound of the first layer 110 to a significantly lesser degree than the coating polymer for DUV filtering.

Then, the second layer 120 may be soft-baked. The soft baking may be performed at a temperature of about 50° C. to about 150° C. for about 20 seconds to about 5 minutes. The soft baking may fully or partially remove the solvent from the second layer 120. However, the soft baking may be omitted depending on the viscosity and thickness of the second layer 120, and the kind of the solvent used in the coating composition (i.e., miscibility with the solvent used to form the first layer 110).

The second layer 120 may have a thickness of about 5 nm to about 100 nm after the soft baking is complete. If the thickness of the second layer 120 is too small, the second layer 120 may not sufficiently absorb out-of-band light of the DUV wavelength. If the thickness of the second layer 120 is too large, the second layer 120 may insufficiently transmit in-band light of the EUV wavelength to expose the first layer 110 underlying the second layer 120

Figure 1C:
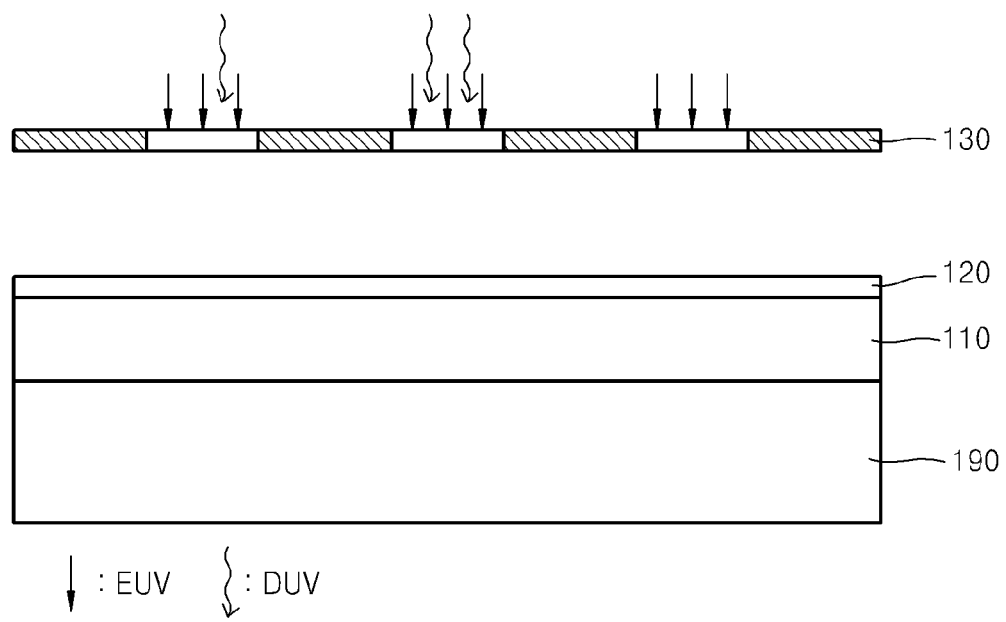
Figure 1D:
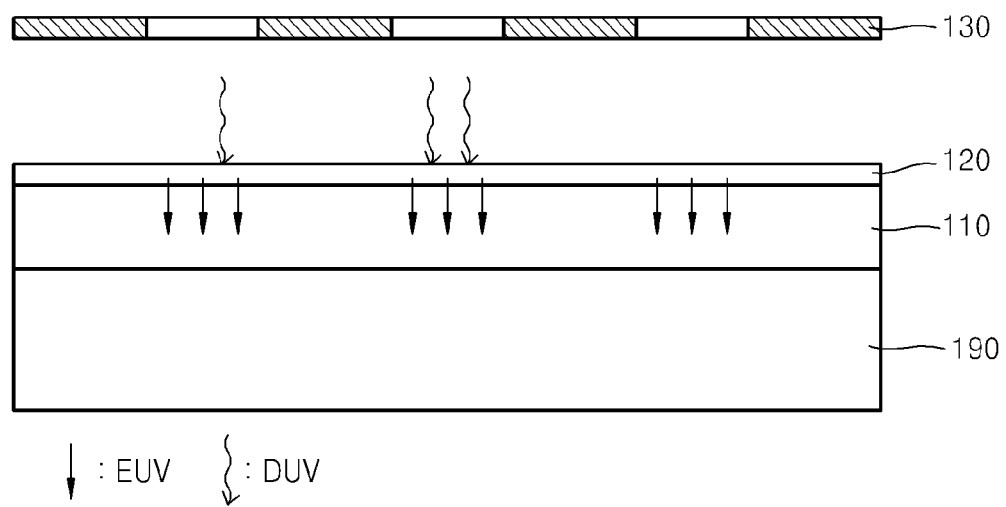
Figure 1E:
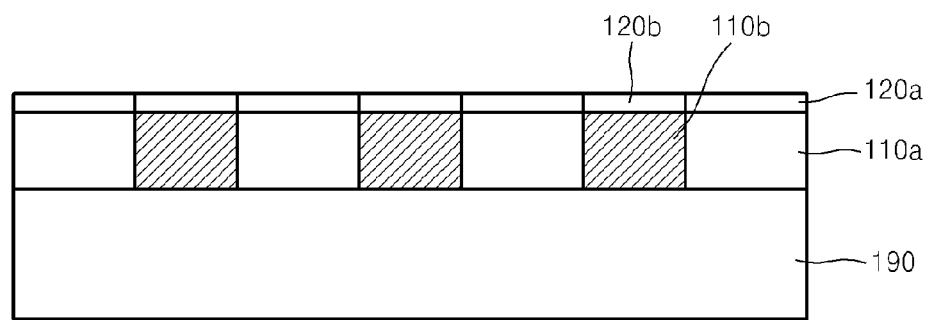

FIGS. 1C to 1E illustrate changes in the first and second layers 110 and 120 when exposed to EUV and DUV light through an exposure mask 130. Referring to FIG. 1C, the first and second layers 110 and 120 may be exposed to light through the exposure mask 130. The exposure light may be a EUV wavelength of light that is about 100 nm or less, as described above, and in particular, about 50 nm or less. In some embodiments the EUV wavelength of light may be from about 10 nm to about 20 nm. In some embodiments, the EUV may be a wavelength of light of about 13.5 nm.

However, the exposure light emitted from a light source (not shown) may include, to some extent, a DUV wavelength of light, in some embodiments, of from about 100 nm to about 300 nm, as illustrated in FIG. 1C. As described above, the coating polymer for forming the second layer 120 may have a degree of absorption of about 50%/μm or greater with respect to 193-nm wavelength light. Thus, as illustrated in FIG. 1D, the DUV wavelength of light may be mostly blocked by the second layer 120, and only the EUV wavelength of light may reach the first layer 110.

Referring to FIG. 1E, unexposed regions 110a and 120a and exposed regions 110b and 120b may result in the respective first and second layers 110 and 120. An example where the first layer 110 is formed of a positive photoresist is specifically described. However, the description provided may be applicable to an embodiment in which the first layer 110 is formed of a negative photoresist, and thus, a description of such an embodiment will not be specifically provided.

Referring to FIG. 1E, the exposed regions 110b and 120b of the respective first and second layers 110 and 120 may be chemically modified to be prone to dissolve in a developing solution, which will be described later. Chemical modification, as used herein, refers to a process of separating a protection group by the photo-acid generator through exposure to light.

Next, post-exposure baking (PEB) may be performed at a temperature of about 50° C. to about 200° C. The PEB may be performed for about 20 seconds to about 150 seconds.

Figure 1F:
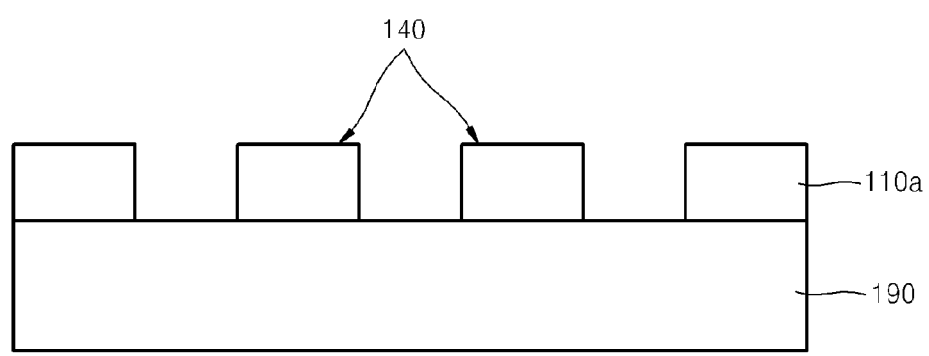

Referring to FIG. 1F, the exposed regions 110b and 120b may be removed by a developing process. The developing process may remove the exposed regions 110b and 120b by developing them in a developing solution. In some embodiments, the exposed regions 110b and 120b may be simultaneously developed using one developing solution. In this regard, the developing solution may be chosen to dissolve the coating polymer forming the second layer 120.

The developing solution may be an alkali solution in which is dissolved, for example, sodium hydroxide, potassium hydroxide, sodium carbonate, sodium silitate, sodium metasilicate, ammonia, ethylamine, n-propylamine, diethylamine, di-n-propylamine, triethylamine, methyldiethylamine, dimethylethanolamine, triethanolamine, tetramethylammoniumhydroxide, tetraethylammoniumhydroxide, tetrapropylammoniumhydroxide, tetrabutylammoniumhydroxide, pyrrole, piperidine, choline, 1,8-diazabicyclo-[5.4.0]-7-undecene, or 1,5-diazabicyclo-[4.3.0]-5-nonane. These developing solutions may further include an appropriate amount of an aqueous organic solvent selected from among alcohols including, for example, methanol or ethanol, or an appropriate amount of a surfactant. When such an alkali developing solution is used, the developing process may be followed by rinsing with deionized (DI) water or a mixture of DI water and a surfactant.

The developing solution may mainly serve to remove the exposed region 110b of the first layer 110. However, the exposed and unexposed regions 120a and 120b of the second layer 120 may be substantially completely removed by the developing solution.

The developing process may result in a photoresist pattern 140, as illustrated in FIG. 1F. In the method according to the current embodiment, the second layer 120 may facilitate formation of a finer photoresist pattern by preventing the DUV wavelength from entering the first layer 110, as illustrated in FIG. 1D.

According to the embodiments, a method of fabricating semiconductor devices may include: forming a photoresist pattern on a semiconductor substrate; and etching a layer underlying the photoresist pattern with the photoresist pattern as an etch mask. The forming of the photoresist pattern on the semiconductor substrate may include: forming a first layer of a photoresist composition for EUV on a semiconductor substrate; forming a second layer of a coating composition for DUV filtering on the first layer; exposing the first and second layers with an exposure mask; and developing the first and second layers. In this regard, the coating composition for DUV filtering may include about 100 parts by weight of a solvent (including a first solvent that is an alcohol-based solvent); and about 0.05 parts by weight to about 5 parts by weight of a coating polymer (having a degree of absorption of about 50%/μm or greater with respect to 193-nm incident light). The amount of the coating polymer may be from about 0.1 parts by weight to about 3 parts by weight, and in some embodiments, from about 0.3 parts by weight to about 2.5 parts by weight.

Hereinafter, an embodiment of a method of fabricating a semiconductor device will be described with reference to FIGS. 2A to 2E. FIGS. 2A to 2E illustrate cross-sectional views of stages in a method of fabricating a semiconductor device according to an embodiment.

Figure 2A:
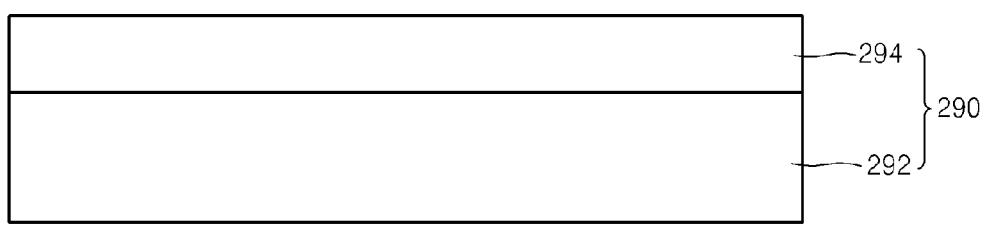
FIGS. 2A to 2E illustrate cross-sectional views of stages in a method of fabricating a semiconductor device, according to an embodiment.

Referring to FIG. 2A, a semiconductor substrate 290, including a base substrate 292 and first material layer 294 may be prepared. The base substrate 292 may be a silicon substrate, a silicon-on-insulator (SOI) substrate, a silicon-germanium substrate, or a gallium-arsenide substrate. However, the semiconductor substrate 290 is not limited thereto and a variety of substrates may be used. For example, a bare wafer, or a substrate having a structure on an active surface thereof may be used.

The first material layer 294 may be a material layer having an etching selectivity with respect to the base substrate 292. Any suitable material layer may be used. In some embodiments, the first material layer 294 may be a silicon oxide layer, a silicon nitride layer, a silicon oxynitride layer, a metal layer, such as a copper, tungsten, or aluminum layer, a metal oxide layer, a metal nitride layer, a metal oxynitride layer, or the like.

Although FIG. 2A illustrates the base substrate 292 having a flat surface on which the first material layer 294 is formed, the base substrate 292 may not necessarily be flat and may have a selected structure on the surface.

Figure 2B:
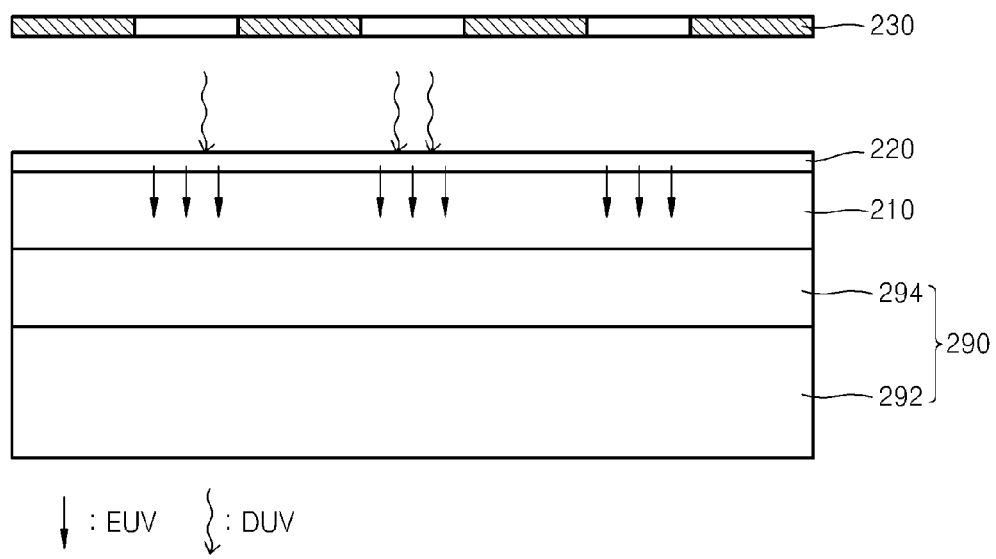

Referring to FIG. 2B, a first layer 210 and a second layer 220 may be formed on the semiconductor substrate 290, as described in the previous embodiment, which may be followed by a baking process, if desired. The same processes as those described above with respect to previous embodiments will not be repeated to avoid redundancy.

Next, the first layer 210 and the second layer 220 may be exposed to an EUV wavelength of light through an exposure mask 230. Like the previously described embodiment, an exposure light source that emits the EUV wavelength of light may also emit a DUV wavelength of light to some extent. The DUV wavelength of light may be absorbed by the second layer 220, and thereby, be blocked from reaching the first layer 210, as seen in FIG. 2B. Thus, the first layer 210 may have a good exposure resolution.

Figure 2C:
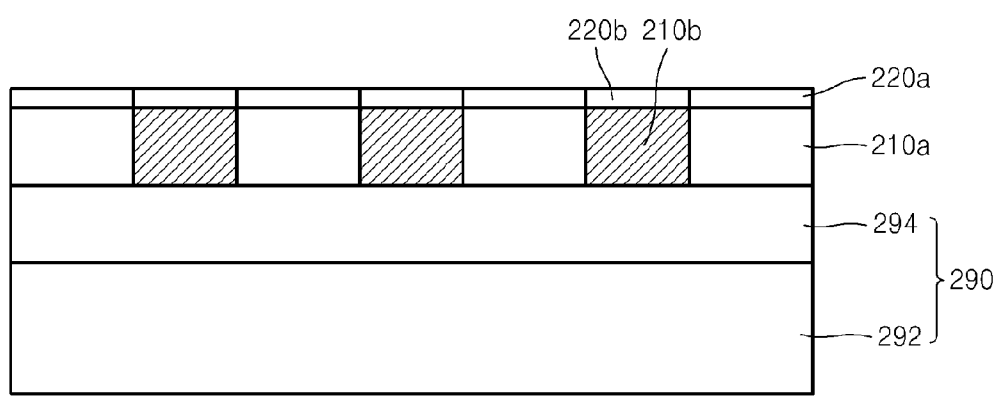

Referring to FIG. 2C, through exposure to the EUV wavelength of light, unexposed regions 210a and 220a and exposed regions 210b and 220b may result in the respective first and second layers 210 and 220. The current embodiment provides an example of an embodiment in which the first layer 210 is formed of a positive photoresist as described above with respect to the previous embodiment.

Figure 2D:
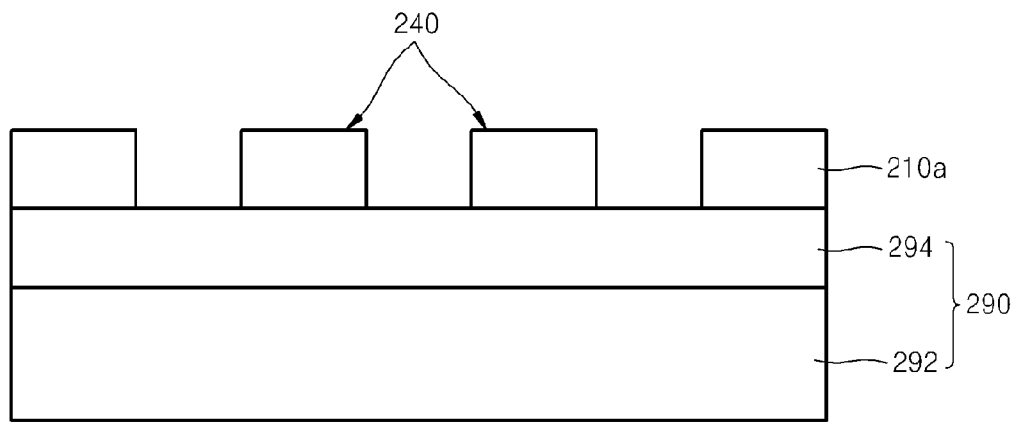

Next, referring to FIG. 2D, the unexposed and exposed regions 210a and 210b of the first layer 210 and the unexposed and exposed regions 220a and 220b of the second layer 220 may be subjected to a developing process to obtain a desired photoresist structure 240 having good resolution and high precision.

Figure 2E:
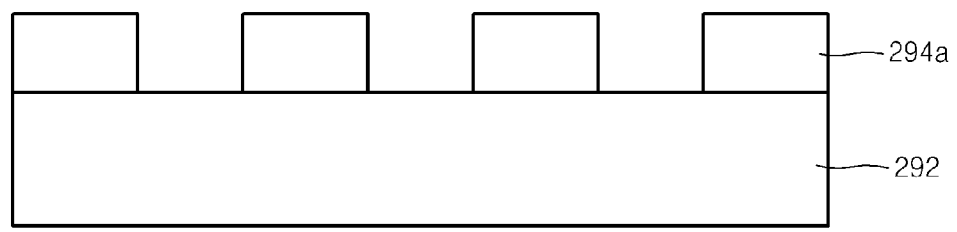

Next, referring to FIG. 2E, the first material layer 294 may be etched using the photoresist structure 240 as an etch mask to form a desired structure 294a on the base substrate 292. The etching may be anisotropic etching, such as plasma etching. In some embodiments, the etching may be isotropic etching.

The structure 294a may be any of various types of structures. In some embodiments, the structure 294a may be a structure to define an active region, a line-and-space structure, an insulating layer structure including a hole(s), or the like. Those skilled in the art may understand methods of fabricating semiconductor devices by using these structures, and thus, a detailed description thereof will not be provided here.

Embodiments will be described in further detail with reference to the following experiments. These experiments are for illustrative purposes only and are not intended to limit the scope of the present inventive concept.

EXPERIMENTS

Film Forming Characteristics Test

Coating compositions for DUV filtering including different concentrations of either Novolac resin (having a number-averaged molecular weight (Mn) of 6,724 and a polydispersity index (PDI) of 1.71) or polyhydroxystyrene (PHS) resin (having a Mn of 2988 and a PDI of 1.72) and different solvents, were used to test film forming characteristics (Experiments 1-34). Mixtures of the resins and solvents were stirred for 3 hours and were then filtered by using a 20-nm filter. Mn, Mw, and PDI were measured using a gel permeation chromatograph (GPC) (Waters, HPLC 2414). The column used was Shodex KF-803, and tetrahydrofuran (THF) was used as an eluent. In addition, polystyrene standard was used.

The filtrates were coated on 300-mm wafers at about 1,000 rpm by using a CLEAN TRACK ACT12 (Tokyo Electron Ltd.) and then were baked at about 120° C. or 60 seconds. Thicknesses of the resulting films were measured. The results are shown in Table 1 below.

TABLE 1

Film forming characteristics test results for compositions including one solvent

| Experiment | Resin | Solvent | Concentration (%) | Thickness (nm) |
|---|---|---|---|---|
| 1 | Novolak | 4-methyl-2-pentanol | 0.38 | 15.2 |
| 2 | Novolak | 4-methyl-2-pentanol | 0.50 | 16.5 |
| 3 | Novolak | 4-methyl-2-pentanol | 0.66 | 22.8 |
| 4 | Novolak | 4-methyl-2-pentanol | 1.0 | 31.1 |
| 5 | Novolak | 4-methyl-2-pentanol | 1.5 | 49.8 |
| 6 | PHS | 4-methyl-2-pentanol | 0.43 | 18 |
| 7 | PHS | 4-methyl-2-pentanol | 0.50 | 13.6 |
| 8 | PHS | 4-methyl-2-pentanol | 0.65 | 25.4 |
| 9 | PHS | 4-methyl-2-pentanol | 1.0 | 34.6 |
| 10 | PHS | 4-methyl-2-pentanol | 1.5 | 57.6 |
| 11 | Novolak | 2-methyl-2-pentanol | 0.50 | 17 |
| 12 | Novolak | 2-methyl-2-pentanol | 1.0 | 32 |
| 13 | Novolak | 2-methyl-2-pentanol | 1.5 | 50 |
| 14 | PHS | 2-methyl-2-pentanol | 0.50 | 15 |
| 15 | PHS | 2-methyl-2-pentanol | 1.0 | 36 |
| 16 | PHS | 2-methyl-2-pentanol | 1.5 | 60 |
| 17 | Novolak | isopropanol | 0.50 | 16.5 |
| 18 | Novolak | isopropanol | 1.0 | 30.8 |
| 19 | Novolak | isopropanol | 1.5 | 48.5 |
| 20 | PHS | isopropanol | 0.50 | 14.4 |
| 21 | PHS | isopropanol | 1.0 | 35.7 |
| 22 | PHS | isopropanol | 1.5 | 99.1 |
| 23 | Novolak | 3,3,5-trimethyl-1-hexanol | 0.50 | 17.1 |
| 24 | Novolak | 3,3,5-trimethyl-1-hexanol | 1.0 | 33.2 |
| 25 | Novolak | 3,3,5-trimethyl-1-hexanol | 1.5 | 51.6 |
| 26 | PHS | 3,3,5-trimethyl-1-hexanol | 0.50 | 15.1 |
| 27 | PHS | 3,3,5-trimethyl-1-hexanol | 1.0 | 36.4 |
| 28 | PHS | 3,3,5-trimethyl-1-hexanol | 1.5 | 58 |
| 29 | Novolak | methanol | 0.50 | 16.4 |
| 30 | Novolak | methanol | 1.0 | 30.7 |
| 31 | Novolak | methanol | 1.5 | 48.3 |
| 32 | PHS | methanol | 0.50 | 15 |
| 33 | PHS | methanol | 1.0 | 35.5 |
| 34 | PHS | methanol | 1.5 | 57.7 |

Coating compositions for DUV filtering containing the same kinds of resins as used in Experiments 1-34, and each composition containing two kinds of solvents (first and second solvents), were used to test film forming characteristics, in the same manner as described above (Experiments 35-67). The results are shown in Table 2 below. The first solvent and the second solvent in each composition were mixed at a volume ratio of 9:1.

TABLE 2

Film forming characteristics test results when each composition included mixed solvents

| Experiment | Resin | First Solvent | Second Solvent | Concentration (%) | Thickness (nm) |
|---|---|---|---|---|---|
| 35 | Novolak | 4-methyl-2-pentanol | monomethylether | 0.38 | 15.3 |
| 36 | Novolak | 4-methyl-2-pentanol | monomethylether | 0.5 | 17 |
| 37 | Novolak | 4-methyl-2-pentanol | monomethylether | 1.0 | 32.3 |
| 38 | Novolak | 4-methyl-2-pentanol | monomethylether | 1.5 | 51.6 |
| 39 | PHS | 4-methyl-2-pentanol | propyleneglycol monomethyl ether | 0.38 | 13.7 |
| 40 | PHS | 4-methyl-2-pentanol | propyleneglycol monomethyl ether | 0.50 | 15 |
| 41 | PHS | 4-methyl-2-pentanol | propyleneglycol monomethyl ether | 0.66 | 21.4 |
| 42 | PHS | 4-methyl-2-pentanol | propyleneglycol monomethyl ether | 1.0 | 29.7 |
| 43 | PHS | 4-methyl-2-pentanol | propyleneglycol monomethyl ether | 1.5 | 47.5 |
| 44 | Novolak | 2-methyl-2-pentanol | monomethylether | 0.5 | 16.5 |
| 45 | Novolak | 2-methyl-2-pentanol | monomethylether | 1.0 | 32.2 |
| 46 | Novolak | 2-methyl-2-pentanol | monomethylether | 1.5 | 51.4 |
| 47 | PHS | 2-methyl-2-pentanol | propyleneglycol monomethyl ether | 0.50 | 15.6 |
| 48 | PHS | 2-methyl-2-pentanol | propyleneglycol monomethyl ether | 1.0 | 29.9 |

TABLE 2-continued

Film forming characteristics test results when each composition included mixed solvents

| Experiment | Resin | First Solvent | Second Solvent | Concentration (%) | Thickness (nm) |
|---|---|---|---|---|---|
| 49 | PHS | 2-methyl-2-pentanol | propyleneglycol monomethyl ether | 1.5 | 48 |
| 50 | Novolak | isopropanol | xylene | 0.5 | 15.7 |
| 51 | Novolak | isopropanol | xylene | 1.0 | 31.8 |
| 52 | Novolak | isopropanol | xylene | 1.5 | 50.6 |
| 53 | PHS | isopropanol | xylene | 0.50 | 14.9 |
| 54 | PHS | isopropanol | xylene | 1.0 | 28.6 |
| 55 | PHS | isopropanol | xylene | 1.5 | 47.8 |
| 56 | Novolak | 3,3,5-trimethyl-1-hexanol | cyclohexanone | 0.5 | 15.8 |
| 57 | Novolak | 3,3,5-trimethyl-1-hexanol | cyclohexanone | 1.0 | 32 |
| 58 | Novolak | 3,3,5-trimethyl-1-hexanol | cyclohexanone | 1.5 | 50.7 |
| 59 | PHS | 3,3,5-trimethyl-1-hexanol | cyclohexanone | 0.50 | 15 |
| 60 | PHS | 3,3,5-trimethyl-1-hexanol | cyclohexanone | 1.0 | 28.8 |
| 61 | PHS | 3,3,5-trimethyl-1-hexanol | cyclohexanone | 1.5 | 48.1 |
| 62 | Novolak | methanol | butyl acetate | 0.5 | 15.8 |
| 63 | Novolak | methanol | butyl acetate | 1.0 | 15.8 |
| 64 | Novolak | methanol | butyl acetate | 1.5 | 51.2 |
| 65 | PHS | methanol | butyl acetate | 0.50 | 15.5 |
| 66 | PHS | methanol | butyl acetate | 1.0 | 29.1 |
| 67 | PHS | methanol | butyl acetate | 1.5 | 49.5 |

Referring to Tables 1 and 2, the coating compositions for DUV filtering according to Experiments 1-67 were found to form films having appropriate thicknesses.

Film Removal Test

Some of the films formed from the coating compositions of Experiments 1-67 were tested to determine if they could be removed by different developing solutions. The films were subjected to puddle development in a CLEAN TRACK ACT12 (available from Tokyo Electron Ltd.) for 60 seconds. Residual thicknesses of the films were measured to determine if there was any residue left after the development. The results are shown in Table 3 below.

TABLE 3

After-development film residue test results

| Experiment | Resin | Solvent | Developing Solution | Residue |
|---|---|---|---|---|
| 68 | Novolak | 4-methyl-2-pentanol | 2.38% TMAH aqueous solution (a.s.) | none |
| 69 | PHS | 4-methyl-2-pentanol | 2.38% TMAH a.s. | none |
| 70 | Novolak | 2-methyl-2-pentanol | 2.38% TMAH a.s. | none |
| 71 | PHS | 2-methyl-2-pentanol | 2.38% TMAH a.s. | none |
| 72 | Novolak | isopropanol | 2.38% TMAH a.s. | none |
| 73 | PHS | isopropanol | 2.38% TMAH a.s. | none |
| 74 | Novolak | 3,3,5-trimethyl-1-hexanol | 2.38% TMAH a.s. | none |
| 75 | PHS | 3,3,5-trimethyl-1-hexanol | 2.38% TMAH a.s. | none |
| 76 | Novolak | methanol | 2.38% TMAH a.s. | none |
| 77 | PHS | methanol | 2.38% TMAH a.s. | none |
| 78 | Novolak | 4-methyl-2-pentanol, monomethylether | 2.7% trimethanolamine a.s. | none |
| 79 | PHS | 4-methyl-2-pentanol, propyleneglycol monomethyl ether | 2.7% trimethanolamine a.s. | none |
| 80 | Novolak | 2-methyl-2-pentanol, monomethylether | 2.7% trimethanolamine a.s. | none |
| 81 | PHS | 2-methyl-2-pentanol, propyleneglycol monomethyl ether | 2.7% trimethanolamine a.s. | none |
| 82 | Novolak | isopropanol, xylene | 3.5% KOH a.s. | none |
| 83 | PHS | isopropanol, xylene | 3.5% KOH a.s. | none |
| 84 | Novolak | 3,3,5-trimethyl-1-hexanol, cyclohexanone | 3.5% KOH a.s. | none |
| 85 | PHS | 3,3,5-trimethyl-2-hexanol, cyclohexanone | 3.5% KOH a.s. | none |
| 86 | Novolak | methanol, butyl acetate | 3.5% KOH a.s. | none |
| 87 | PHS | methanol, butyl acetate | 3.5% KOH a.s. | none |

Referring to Table 3, the films of Experiments 1-67 were found to be easily removable by these alkali developing solutions.

Miscibility Test Between Photoresist Film and DUV-Filtering Coating Film

Photoresists for EUV were spin-coated on 12-inch silicon wafers that were treated with hexamethyldisilazane (HMDS) at about 120° C. for about 60 seconds, at about 1,000 rpm, and were then soft-baked on a hot plate at about 110° C. for about 60 seconds to form photoresist films. Then, initial thicknesses of the photoresist films were measured.

After the original thickness measurements on the photoresist layers, the coating compositions for DUV filtering prepared above were spin-coated on the photoresist layers at about 1000 rpm, and were then soft-baked at about 90° C. for about 60 seconds to form DUV-filtering coating films. Then, thicknesses of the DUV-filtering coating films were measured.

Finally, the resulting structures were subjected to puddle development in a CLEAN TRACK ACT12 (available from Tokyo Electron Ltd.) for about 60 seconds, and residual thicknesses of the photoresist films were measured. The results are shown in Table 4 below.

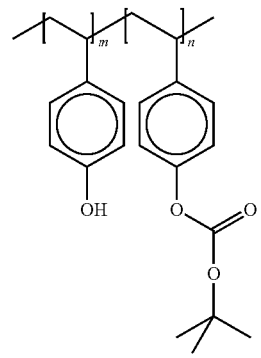

<Formula 6>

Patterning Test

Photoresists for EUV were spin-coated on 12-inch silicon wafers that were treated with HMDS at about 120° C. for 60 seconds, at about 1,000 rpm and were then soft-baked at about 120° C. for about 60 seconds to form photoresist films each having a thickness of about 60 nm. Three samples for each different photoresist for EUV were prepared for comparison.

TABLE 4

Miscibility test results

| Experiment | Photoresist | Initial thickness of photoresist (nm) | DUV-filtering coating composition | Developing solution | Residual thickness (nm) |
|---|---|---|---|---|---|
| 88 | SEVR-139 (ShinEtsu) | 102 | Novolak | 2.38% TMAH a.s. | 101 |
| 89 | SEVR-59 (ShinEtsu) | 101 | Novolak | 2.38% TMAH a.s. | 101 |
| 90 | SEVR-139 (ShinEtsu) | 103 | PHS | 2.38% TMAH a.s. | 103 |
| 91 | SEVR-59 (ShinEtsu) | 103 | PHS | 2.38% TMAH a.s. | 102 |
| 92 | SEP-124 (TOK) | 98 | Novolak | 2.38% TMAH a.s. | 98 |
| 93 | SEP-124 (TOK) | 100 | PHS | 2.38% TMAH a.s. | 100 |
| 94 | EUVR-P1123ME (TOK) | 100 | Novolak | 2.38% TMAH a.s. | 100 |
| 95 | EUVR-P1123ME (TOK) | 101 | PHS | 2.38% TMAH a.s. | 100 |

Referring to Table 4, the structures of Experiments 88-95 exhibited nearly no difference between the initial and residual thicknesses of the photoresist films. This result indicates that the solvents in the coating compositions for DUV filtering were barely mixed with the photoresist films underlying the DUV-filtering coating films, or did not cause the photoresists to diffuse out.

DUV Absorption Test on DUV-Filtering Coating Film

Novolac resin (SAMPLE 1), PHS resin (SAMPLE 2), and a PHS/poly(t-BOC oxystyrene) random copolymer (SAMPLE 3) represented by Formula 6 were coated on transparent substrates respectively to form DUV-filtering coating films. The definitions of m and n in Formula 6 are as provided above. Then, degrees of absorption of the DUV-filtering coating films were measured at a wavelength range of about 200 nm to about 400 nm. The results are shown in FIG. 3.

Figure 3:
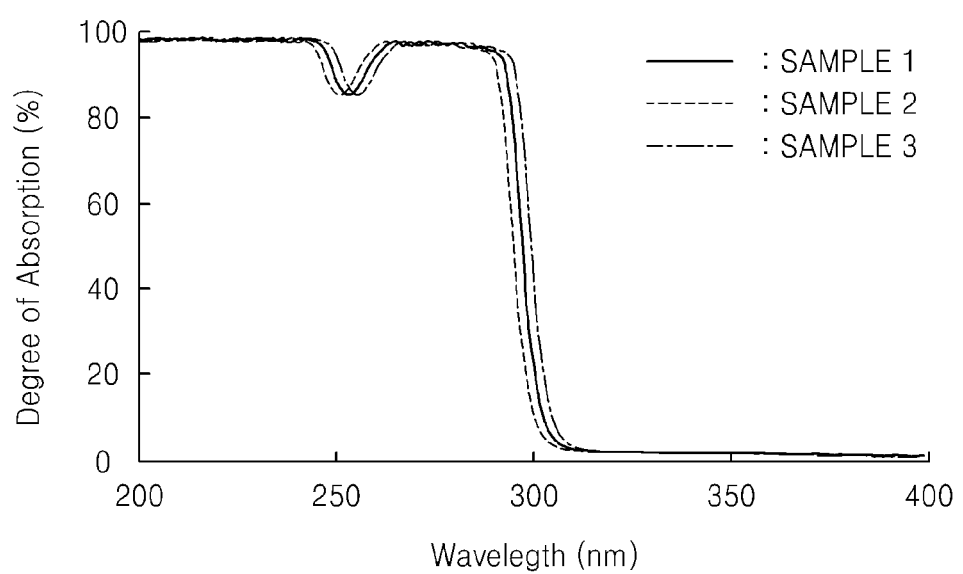
FIG. 3 illustrates a graph of deep ultraviolet (DUV) absorption test results on DUV-filtering coating films formed using coating compositions according to embodiments.

Referring to FIG. 3, the DUV-filtering coating films were found to block 98% or more of the DUV wavelength of light. In FIG. 3, degrees of absorption only with respect to the DUV wavelength of light of 200 nm or greater are shown. However, it will be understood by those of ordinary skill in the art that these DUV-filtering coating films would have higher degrees of absorption at a DUV wavelength of light of less than 200 nm, than at 200 nm or greater, due to a strong inclination of cyclic hydrocarbons such as benzene, naphthalene, or anthracene to block DUV wavelengths of light of less than 200 nm.

Two types of coating compositions for DUV filtering were spin-coated on the photoresist films of two of the three samples for each different photoresist and were then soft-baked at about 90° C. for about 60 seconds to form DUV-filtering coating films. The remaining one sample was not coated with the coating composition for comparison.

The resulting structures on the silicon wafers were subjected to EUV exposures on an ASML ADT at a NA of 0.25 using conventional illumination, wherein an EUV mask having a 30-nm line-and-space pattern was used. The exposure process was followed by PEB at about 90° C. for about 60 seconds, and then, puddle development in a CLEAN TRACK ACT12 (available from Tokyo Electron Ltd.) for about 60 seconds. A 2.38% tetramethylammonium hydroxide (TMAH) aqueous solution was used as a developing solution.

After the development was complete, the resulting patterns were observed using a Hitachi S-9220 to measure line width roughnesses (LWRs) of the patterns. The results are shown in Table 5.

TABLE 5

Patterning test results

| Experiment | Photoresist | DUV-filtering coating composition | LWR (nm) |
|---|---|---|---|
| 96 | SEVR-139 (ShinEtsu) | Novolak | 3.9 |
| 97 | SEVR-59 (ShinEtsu) | Novolak | 4.2 |
| 98 | SEVR-139 (ShinEtsu) | PHS | 4.4 |

TABLE 5-continued

Patterning test results

| Experiment | Photoresist | DUV-filtering coating composition | LWR (nm) |
|---|---|---|---|
| 99 | SEVR-59 (ShinEtsu) | PHS | 4.1 |
| 100 | SEP-124 (TOK) | Novolak | 3.5 |
| 101 | SEP-124 (TOK) | PHS | 3.8 |
| 102 | EUVR-P1123ME (TOK) | Novolak | 3.6 |
| 103 | EUVR-P1123ME (TOK) | PHS | 4.1 |
| 104 | SEVR-139 (ShinEtsu) | — | 5.7 |
| 105 | SEVR-59 (ShinEtsu) | — | 5.6 |
| 106 | SEP-124 (TOK) | — | 6.1 |
| 107 | EUVR-P1123ME (TOK) | — | 5.4 |

Referring to Table 5, those samples coated with the coating compositions for DUV filtering (Experiments 96-103) were found to have more precise 30-nm line-and-space patterns, as compared to those samples coated only with the photoresists for EUV (Experiments 104-107), indicating that using the coating compositions for DUV filtering according to the embodiments may ensure more precise pattern formation.

Embodiments may relate to a coating composition for DUV filtering that facilitates precise formation of a fine pattern, a method of forming a photoresist pattern by using the coating composition, and a method of fabricating a semiconductor device by using the coating composition or the method.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A coating composition for deep ultraviolet (DUV) filtering during an extreme ultraviolet (EUV) exposure, the composition comprising:
   100 parts by weight of a solvent including a first solvent, the first solvent being an alcohol-containing solvent; and
   about 0.05 parts by weight to about 5 parts by weight of a coating polymer having a degree of absorption of about 50%/μm or greater with respect to DUV incident light.

2. The coating composition as claimed in claim 1, wherein the coating polymer includes:
   a backbone having a repeating unit including benzene, naphthalene, or anthracene;
   a branch bonded to a backbone, the branch having a repeating unit including benzene, naphthalene, or anthracene; or
   a repeating unit including a carboxyl group.

3. The coating composition as claimed in claim 2, wherein the coating polymer includes the branch bonded to a backbone, the branch further including a C1-C5 alkylene group between the backbone and the benzene, naphthalene, or anthracene.

4. The coating composition as claimed in claim 1, wherein the coating polymer is selected from the group of poly(hydroxystyrene), a copolymer of a hydroxystyrene derivative and hydroxystyrene, novolac resin, and a mixture thereof.

5. The coating composition as claimed in claim 1, wherein the coating polymer is a copolymer of a hydroxystyrene derivative and hydroxystyrene, the copolymer being a block-copolymer or a random copolymer and being represented by Formula 1 below:

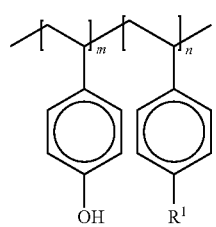

<Formula 1> wherein m and n are integers equal to or greater than 1, where $0.4 \leq m/(m+n) < 1$; and $R_1$ is a hydrogen atom, a $C_1$-$C_6$ alkyl group, a $C_1$-$C_6$ alkoxy group, a $C_1$-$C_6$ alkoxycarbonyloxy group, a $C_2$-$C_6$ acetal group, a $C_2$-$C_6$ acrylate group, trifluoromethyl, trichloromethyl, tribromomethyl, or a halogen atom.

6. The coating composition as claimed in claim 1, wherein the coating polymer has a degree of absorption of about 40%/μm or greater with respect to 248-nm incident light.

7. The coating composition as claimed in claim 1, wherein the coating polymer has a degree of absorption of about 50%/μm or greater with respect to 220-nm incident light.

8. The coating composition as claimed in claim 1, wherein the first solvent includes a C2-C8 monohydric alcohol.

9. The coating composition as claimed in claim 1, wherein the solvent includes about 5 parts by weight to about 30 parts by weight of a second solvent, based on 100 parts by weight of the solvent, the second solvent including one selected from the group of ethyleneglycol, propyleneglycol, tetrahydrofuran, dioxane, ethyleneglycol monomethylether, ethyleneglycol monoethylether, ethyleneglycol dimethylether, ethyleneglycol diethylether, diethyleneglycol monomethylether, diethyleneglycol monoethylether, diethyleneglycol dimethylether, diethyleneglycol diethylether, diethyleneglycol ethylmethylether, propyleneglycol monomethylether, propyleneglycol monoethylether; ethyleneglycol ethyletheracetate, diethyleneglycol ethyletheracetate, propyleneglycol ethyletheracetate, propyleneglycol monomethyletheracetate; toluene, xylene, acetone, methylethylketone, methylisobutylketone, cyclohexanone, 4-hydroxy-4-methyl-2-pentanone, diacetonealcohol, acetic acidmethyl, acetic acidethyl, acetic acidpropyl, acetic acidbutyl, 2-hydroxypropionic acid ethyl, 2-hydroxy-2-methylpropionic acid methyl, 2-hydroxy-2-methylpropionic acid ethyl, ethoxyacetic acid ethyl, hydroxyacetic acid ethyl, 2-hydroxy-3-methylbutanoic acid methyl, 3-methoxypropionic acid methyl, 3-methoxypropionic acid ethyl, 3-ethoxypropionic acid ethyl, 3-ethoxypropionic acid methyl, water, and a mixture thereof.

10. The coating composition as claimed in claim 1, wherein the coating polymer has a weight average molecular weight of about 2,000 to about 100,000, as measured by gel permeation chromatography (GPC).

11. The coating composition as claimed in claim 1, further comprising a photo-acid generator (PAG).

12. The coating composition as claimed in claim 1, further comprising a surfactant.

13. The coating composition as claimed in claim 1, wherein the coating polymer is included in an amount of about 0.1 parts by weight to about 3 parts by weight.

14. The coating composition as claimed in claim 13, wherein the coating polymer is included in an amount of about 0.3 parts by weight to about 2.5 parts by weight.

15. The coating composition as claimed in claim 1, wherein the degree of absorption is measured with respect to 193-nm wavelength incident light.

16. A coating composition for deep ultraviolet (DUV) filtering during an extreme ultraviolet (EUV) exposure, the composition comprising:
    100 parts by weight of a solvent including a first solvent; and
    about 0.05 parts by weight to about 5 parts by weight of a coating polymer having a degree of absorption of about 50%/μm or greater with respect to DUV incident light, and
    wherein the first solvent is an alcohol-based solvent including at least one organic compound selected from the group consisting of methanol, ethanol, 1-propaneol, isopropaneol, n-propaneol, n-butanol, 2-butanol, tert-butanol, 1-pentanol, 2-pentanol, 3-pentanol, n-hexanol, cyclohexanol, 2-methyl-2-butanol, 3-methyl-2-butanol, 2-methyl-1-butanol, 3-methyl-1-butanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 2,2-dimethyl-3-pentanol, 2,3-dimethyl-3-pentanol, 2,4-dimethyl-3-pentanol, 4,4-dimethyl-2-pentanol, 3-ethyl-3-pentanol, 1-heptanol, 2-heptanol, 3-heptanol, 2-methyl-2-hexanol, 2-methyl-3-hexanol, 5-methyl-1-hexanol, 5-methyl-2-hexanol, 2-ethyl-1-hexanol, 4-methyl-3-heptanol, 6-methyl-2-heptanol, 1-octanol, 2-octanol, 3-octanol, 2-propyl-1-pentanol, 2,4,4-trimethyl-1-pentanol, 2,6-dimethyl-4-heptanol, 3-ethyl-2,2-dimethyl-pentanol, 1-nonanol, 2-nonanol, 3,5,5-trimethyl-1-hexanol, 1-decanol, 2-decanol, 4-decanol, 3,7-dimethyl-1-octanol, and 3,7-dimethyl-3-octanol.

17. A coating composition for deep ultraviolet (DUV) filtering during an extreme ultraviolet (EUV) exposure, the composition comprising:
    100 parts by weight of a solvent including a first solvent, the first solvent being an alcohol-based solvent; and
    about 0.05 parts by weight to about 5 parts by weight of a coating polymer having a degree of absorption of about 50%/μm or greater with respect to DUV incident light, and
    wherein the coating polymer has a solubility with respect to the first solvent that is about 10 times greater than that of a (meth)acrylate-based resin with respect to the first solvent.

* * * * *